(12) United States Patent
Shimoishizaka et al.

(10) Patent No.: US 7,279,357 B2
(45) Date of Patent: Oct. 9, 2007

(54) METHOD FOR FABRICATING A CHIP-SCALE-PACKAGING (CSP) HAVING AN INDUCTOR

(75) Inventors: Nozomi Shimoishizaka, Kyoto (JP); Kazuyuki Kaino, Osaka (JP); Yoshifumi Nakamura, Osaka (JP); Keiji Miki, Kyoto (JP); Kazumi Watase, Kyoto (JP); Ryuichi Sahara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 76 days.

(21) Appl. No.: 11/122,094

(22) Filed: May 5, 2005

(65) Prior Publication Data

US 2005/0199979 A1   Sep. 15, 2005

Related U.S. Application Data

(62) Division of application No. 10/442,139, filed on May 21, 2003, now Pat. No. 6,914,331.

(30) Foreign Application Priority Data

May 27, 2002   (JP) .............................. 2002-152822

(51) Int. Cl.
*H01L 21/311* (2006.01)
*H01L 21/3205* (2006.01)
*H01L 23/48* (2006.01)

(52) U.S. Cl. ...................... 438/107; 438/612; 438/781; 438/E21.022; 438/E21.027

(58) Field of Classification Search ........ 438/612–613, 438/618, 624, 637, 107, 781
See application file for complete search history.

(56) References Cited

U.S. PATENT DOCUMENTS

| | | | |
|---|---|---|---|
| 6,162,652 A * | 12/2000 | Dass et al. .................... | 438/18 |
| 6,492,198 B2 | 12/2002 | Hwang | |
| 6,512,298 B2 * | 1/2003 | Sahara et al. ............... | 257/773 |
| 6,559,528 B2 | 5/2003 | Watase et al. | |
| 6,852,616 B2 | 2/2005 | Sahara et al. | |
| 2001/0045616 A1 | 11/2001 | Yoshitomi | |

(Continued)

FOREIGN PATENT DOCUMENTS

JP        03-238846 A      10/1991

(Continued)

*Primary Examiner*—Anh Duy Mai
(74) *Attorney, Agent, or Firm*—McDermott Will & Emery LLP (57) ABSTRACT

A semiconductor device has a semiconductor chip, a first insulating film and an inductor. The semiconductor chip includes an integrated circuit formed on the main surface of the chip and a plurality of pad electrodes formed on the main surface of the chip and electrically connected to the integrated circuit. The first insulating film of an insulating resin material is formed on the main surface of the semiconductor chip, covers the integrated circuit, and includes a plurality of contact holes provided on the respective pad electrodes. The inductor is formed on the inductor formation region of the first insulating film, and both terminals of the inductor are connected to the pad electrodes through the contact holes, respectively. The inductor formation region of the first insulating film is formed thicker than a portion of the first insulating film around the contact hole.

18 Claims, 8 Drawing Sheets

U.S. PATENT DOCUMENTS

| | | |
|---|---|---|
| 2002/0017730 A1 | 2/2002 | Tahara et al. |
| 2002/0093082 A1 | 7/2002 | Miyamoto et al. |
| 2004/0023450 A1 | 2/2004 | Katagiri et al. |

FOREIGN PATENT DOCUMENTS

| | | |
|---|---|---|
| JP | 08-172161 A | 7/1996 |
| JP | 2001-093932 | 4/2001 |
| JP | 2001-230369 | 8/2001 |
| JP | 2002-57292 | 2/2002 |
| JP | 2002 164468 | 6/2002 |
| JP | 2003-347472 | 12/2003 |

\* cited by examiner

PRIOR ART

METHOD FOR FABRICATING A CHIP-SCALE-PACKAGING (CSP) HAVING AN INDUCTOR

This application is a divisional of U.S. patent application Ser. No. 10/442,139, filed May 21, 2003, which has issued as U.S. Pat. No. 6,914,331, on Jul. 5, 2005, which claims priority of Japanese application 2002-152822, filed May 27, 2002, and the contents of which are hereby incorporated by reference.

BACKGROUND OF THE INVENTION

The present invention relates to a semiconductor device which allows packaging of high density for protecting an integrated circuit formed on a semiconductor chip and ensuring electrical connection between the integrated circuit and an external device in its chip shape, and relates to a method for fabricating the same.

In recent years, as electrical equipment becomes more downsized and more sophisticated in functionality, semiconductor devices (semiconductor packages) have been requested to provide multiple terminals resulting from miniaturization and greater packing density of the packages. To respond this request, various types of chip scale packages (CSPs) have been developed as small-size packages having multiple terminals.

In particular, a wafer-level CSP (WL-CSP) has recently received attention as a technique capable of providing the ultimate small-size package having a size similar to that of a bare chip. The WL-CSP is formed by applying an insulating resin film on the entire surface of a semiconductor wafer on which a plurality of integrated circuits are provided, forming on the applied film interconnects for electrically connecting pad electrodes of the integrated circuits to external terminals such as bumps through contact holes, and dividing the semiconductor wafer into chip-size parts in the final process step.

Moreover, an enhanced semiconductor package was announced in which inductors, conventionally provided as separate components from the semiconductor chip, that is, provided as so-called external components, were formed on an insulating resin film of a WL-CSP semiconductor device by the use of materials constituting interconnects of the device to external terminals. The WL-CSP semiconductor device having inductors is also expected as an ultrasmall semiconductor package applicable to applications utilizing a frequency of hundreds of megahertzes (MHz) to several gigahertzes (GHz), such as potable devices and wireless LAN devices.

Hereinafter, a conventional WL-CSP semiconductor device having inductors formed on an insulating resin film covering an integrated circuit will be described with reference to the accompanying drawings.

Figure 7:
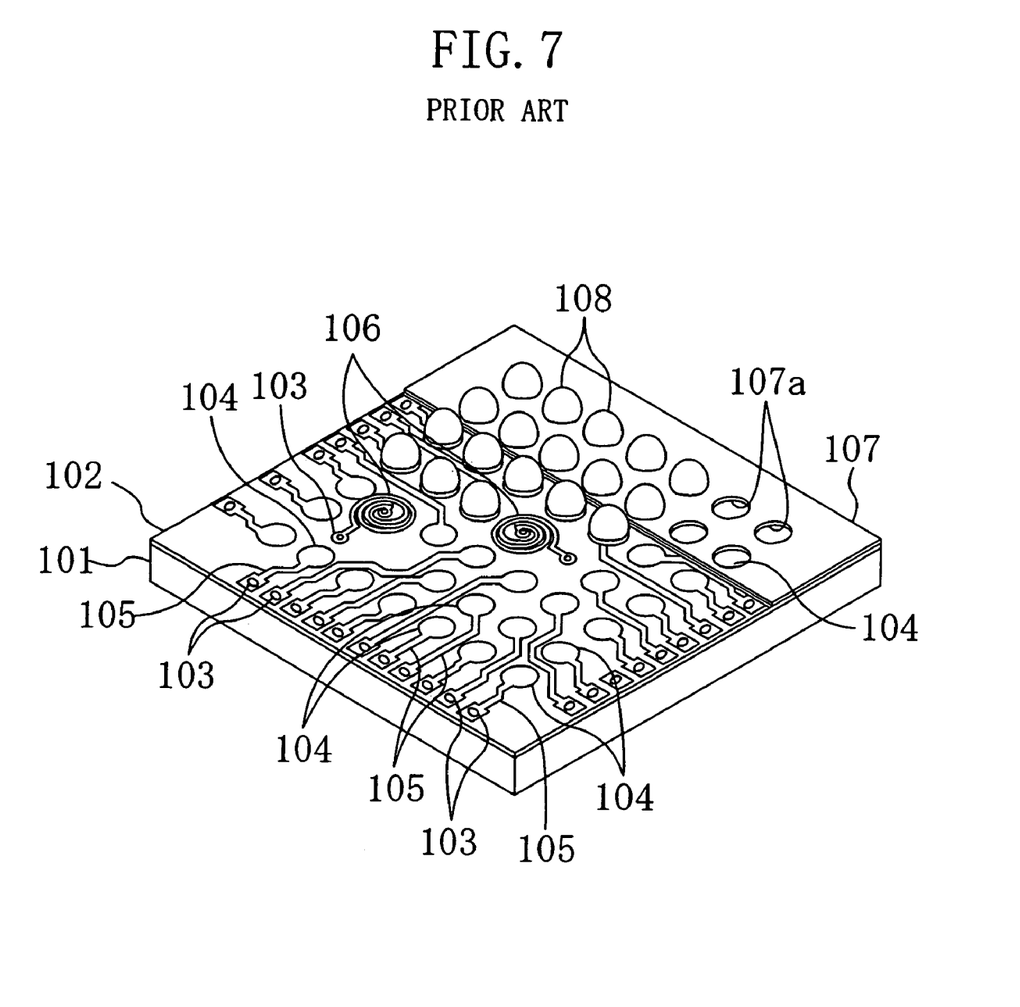
FIG. 7 is a perspective view showing a conventional WL-CSP semiconductor device, in which an outer insulating film is partly broken away to expose inductors and some of interconnects.

FIG. 7 is a perspective view showing the conventional WL-CSP semiconductor device, in which an outer insulating film is partly broken away to expose inductors and some of interconnects.

As shown in FIG. 7, a first insulating resin film 102 having a thickness of about 4 μm to 6 μm is formed, through a passivation film, on the main surface of a semiconductor chip 101 with an integrated circuit formed on the main surface. In the first insulating resin film 102, a plurality of contact holes 103 are formed to expose pad electrodes (not shown) of the integrated circuit.

A plurality of lands 104 of substantially flat-circular shape are formed on the first insulating resin film 102. On the film 102, interconnects 105 are also formed of which one end is connected to the corresponding contact hole 103 and of which the other end is connected to the corresponding land 104. Regions of the first insulating resin film 102 provided with the lands 104 relatively sparsely are formed with an inductor 106 of which both terminals are connected to the pad electrodes through the contact holes 103, respectively. In this structure, the land 104, interconnect 105 and inductor 106 are patterned by copper (Cu) plating using a resist pattern as a mask.

On the first insulating resin film 102, a second insulating resin film 107 is formed which covers the interconnects 105 and the inductors 106 and which has a plurality of openings 107a exposing the lands 104. Over each of the openings 107a, an external terminal 108 of a soldering paste material is formed by printing.

The characteristic of an inductor is generally expressed by a Q value. The Q value is obtained by dividing a value of an energy input supplied to an inductor by a value of an energy loss caused by the inductor. Thus, the higher the Q value is, the smaller the energy loss of the inductor becomes.

In the conventional WL-CSP semiconductor device described above, the loss energy of the inductor 106 is the total of a heat loss caused by a resistance component of the inductor 106, a dielectric loss caused in the first and second insulating resin films 102 and 107 or the like, and a loss caused by signal leakage from the inductor 106 into the semiconductor chip 101 through the first insulating resin film 102 (referred hereinafter to as a leakage loss).

Figure 8:
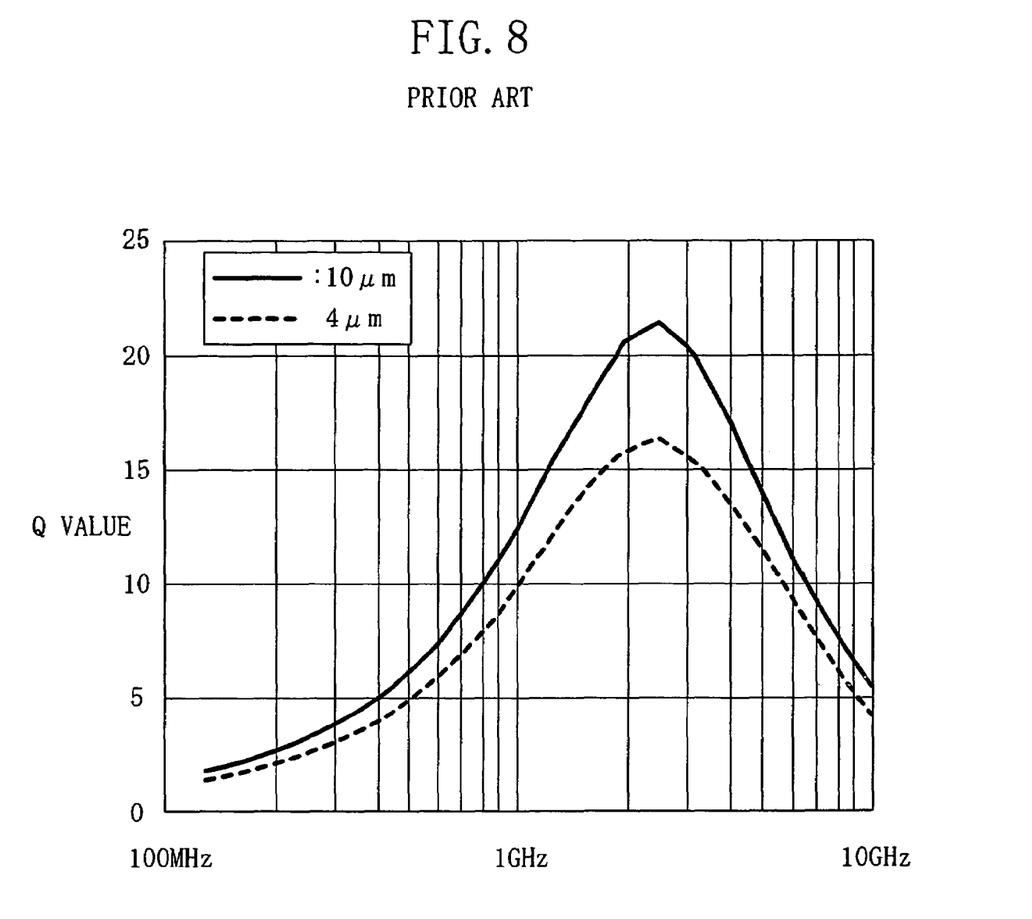
FIG. 8 is a graph showing the frequency dependence of the Q value of an inductor in the conventional WL-CSP semiconductor device, in which the thickness of an inductor formation region is used as a parameter.

The heat loss is substantially determined by the size and the material of the inductor 106, and the dielectric loss is substantially determined by the material of the first and second insulating resin films 102 and 107. To reduce the leakage loss, the first insulating resin film 102 needs only to be thick. Herein, FIG. 8 shows an exemplary result of calculation on the frequency dependence of the Q value of the inductor 106 using the thickness of the first insulting resin film 102 as a parameter. As shown in FIG. 8, it is clear that as the thickness of the first insulating resin film 102 is increased from 4 μm to 10 μm, the Q value thereof increases.

However, the first insulating resin film 102 of the above conventional WL-CSP semiconductor device has the upper limit in thickness of about 4 μm to 6 μm. The reason for this is that the conventional WL-CSP semiconductor device uses a photosensitive resin material for the first insulating resin film 102, and therefore the first insulating resin film 102 has a limitation of the thickness according to the resolution of light exposure in forming the contact hole 103 in the first insulating resin film 102. This thickness limitation makes it impossible to thicken the first insulating film 102 to such a thickness that a leakage loss in the inductor 106 is reduced sufficiently. Therefore, high-frequency signals leak from the inductor 106 into the semiconductor chip 101 through the first insulating resin film 102. The leakage loss in the inductor 106 thus caused is too great to ignore, so that application of the WL-CSP semiconductor device shown in FIG. 7 to a high-frequency device causes the problem of a significant degradation of the high-frequency properties thereof.

SUMMARY OF THE INVENTION

An object of the present invention is to solve the foregoing problems, and to provide a WL-CSP semiconductor device having an inductor formed on an insulating resin film of a semiconductor chip and capable of reducing a leakage loss in the inductor through the insulating resin film.

To achieve this object, a semiconductor device of the present invention has the structure in which an inductor formation region of an insulating resin film covering the upper surface of the semiconductor device is formed thicker than the other region. Further, a method for fabricating a semiconductor device of the present invention has the process in which the thickened inductor formation region of the insulating resin film is masked to remove the top of the unmasked surrounding region of the film and therefore the portion of the thickened insulating resin film where a contact hole is to be formed is thinned.

Specifically, a semiconductor device of the present invention comprises: a semiconductor chip including an integrated circuit formed on the main surface of the chip and a plurality of pad electrodes formed on the main surface of the chip and electrically connected to the integrated circuit; a first insulating film of an insulating resin material which is formed over the main surface of the semiconductor chip, covers the integrated circuit, and includes a plurality of contact holes provided on the respective pad electrodes; and an inductor which is formed on an inductor formation region of the first insulating film and of which both terminals are connected to the pad electrodes through the contact holes, respectively. In the semiconductor device, the inductor formation region of the first insulating film is formed to have a greater thickness than a portion of the first insulating film around the contact hole.

The semiconductor device of the present invention makes it possible to reduce a leakage loss caused due to the leakage of high-frequency signals from the inductor into the semiconductor chip through the first insulating film since the thickness of the inductor formation region of the first insulating film is greater than that of the portion of the first insulating film around the contact hole. Moreover, even when the first insulating film is made of photosensitive resin, the formation of the contact hole is insensitive to the upper limit of the resolution. This makes it possible to ensure an appropriate formation of the contact hole. As a result, an inductor having a high Q value can be formed, and therefore the operating characteristic of the device as a high-frequency semiconductor device is surely improved.

Preferably in the inventive device, the inductor formation region has a thickness of 5 µm to 50 µm inclusive, and the portion of the first insulating film around the contact hole has a thickness of 4 µm to 6 µm inclusive.

Preferably, the inventive device further comprises: a land formed on the first insulating film; and an interconnect of which one end is connected to the corresponding pad electrode through the contact hole and of which the other end is connected to the corresponding land.

Preferably, the inventive device further comprises a protruding electrode formed on the land.

Preferably, the inventive device further comprises a second insulating film of an insulating resin material formed over the first insulating film and covering the inductor and interconnect.

A method for fabricating a semiconductor device of the present invention comprises: a first step of forming a first insulating film over the entirety of main surface of a semiconductor wafer including the surfaces of a plurality of pad electrodes, the semiconductor wafer having a plurality of integrated circuits and the plurality of pad electrodes, the plurality of integrated circuits being formed on the main surface of the chip, the plurality of pad electrodes being formed on the main surface of the chip and electrically connected to the corresponding integrated circuits; a second step of masking an inductor formation region of the first insulating film and removing upper portions of the first insulating film other than the masked inductor formation region; a third step of forming a plurality of contact holes exposing therein the respective pad electrodes in portions of the first insulating film whose upper portions have been selectively removed and which are located on the respective pad electrodes; and a fourth step of forming, on the inductor formation region of the first insulating film, an inductor of which both terminals are connected to the pad electrodes through the contact holes, respectively.

With the inventive method for fabricating a semiconductor device, the inductor formation region of the first insulating film is made thicker than a portion of the first insulating film in which a contact hole is to be formed. This ensures that the semiconductor device of the present invention is obtained.

In the inventive method, the first insulating film is preferably made of a positive photosensitive resin material. Thus, only the light-exposed portion of the positive photosensitive resin is removed by development. Therefore, even in the portion of the first insulating film other than the masked region (the contact-hole formation portion), only the top thereof is subjected to light exposure, thereby leaving the contact-hole formation portion of the first insulating film after the subsequent development.

Preferably in this case, the second step comprises the sub-step of exposing the photosensitive resin material to light with the inductor formation region of the photosensitive resin material masked, and then removing the light-exposed portions of the photosensitive resin material by development. Furthermore, the third step comprises the sub-step of selectively exposing to light portions of the photosensitive resin material whose upper portions have been selectively removed by the development and which are located on the respective pad electrodes, and then removing the light-exposed portions by development.

Preferably in this case, the thicknesses of the portions of the photosensitive resin material to be exposed to light in the second step are set to such an extent that the remaining portions of the photosensitive resin material located under the portions thereof to be exposed to light and on the pad electrodes can obtain a desired resolution.

Preferably in the inventive method, the second step further comprises the sub-step of focusing exposure light onto the position in the vicinity of the surface of the photosensitive resin material, and the third step further comprises the sub-step of focusing exposure light onto the position in the vicinity of the surface of each portion of the photosensitive resin material whose upper portion has been selectively removed.

Preferably in the inventive method, the photosensitive resin is cured after the third step.

In the inventive method, the fourth step comprises the sub-steps of: forming a plating seed layer over the entire surface of the first insulating film including the surfaces of the contact holes; forming a resist pattern including a pattern for an inductor and a pattern for a land and an interconnect, the pattern for an inductor being located on the inductor formation region of the plating seed layer, the pattern for a land and an interconnect being located on a region of the plating seed layer other than the inductor formation region; forming a metal film on the plating seed layer by plating using the resist pattern as a mask; and removing the resist pattern and then removing the plating seed layer by etching using the metal film as a mask, thereby forming an inductor, a land and an interconnect from the metal film.

Preferably in this case, the inventive method further comprises, after the fourth step, the steps of: forming a second insulating film over the entire surface of the first insulating film including the surfaces of the inductor, land and interconnect; and forming an opening in a portion of the second insulating film on the land and then forming a protruding electrode in the opening so that it is connected to the land and the top thereof protrudes from the second insulating film.

Preferably in the inventive method, the semiconductor wafer is provided with scribe lines with which the plurality of integrated circuits are defined to each other; and the method comprises the step of dividing the semiconductor wafer along the scribe lines to form a plurality of semiconductor chips after the fourth step.

BRIEF DESCRIPTION OF THE DRAWINGS

FIGS. 2A and 2B show the semiconductor device according to the embodiment of the present invention.

DETAILED DESCRIPTION OF THE INVENTION

An embodiment of the present invention will be described below with reference to the accompanying drawings.

Figure 1:
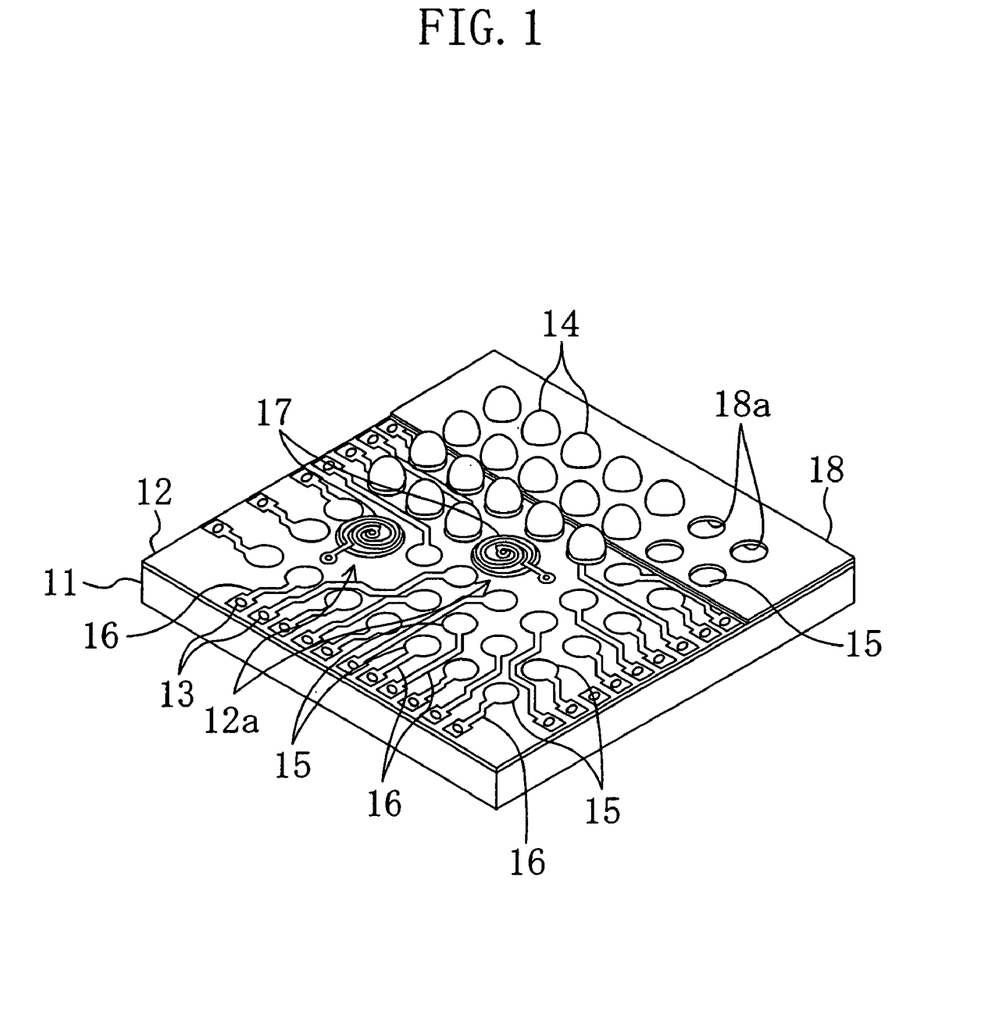
FIG. 1 is a perspective view showing a semiconductor device according to an embodiment of the present invention, in which an outer insulating film is partly broken away to expose inductors and some of interconnects.

FIG. 1 is a perspective view showing a WL-CSP semiconductor device according to the embodiment of the present invention, in which an outer insulating film is partly broken away to expose inductors and some of interconnects.

Figure 2A:
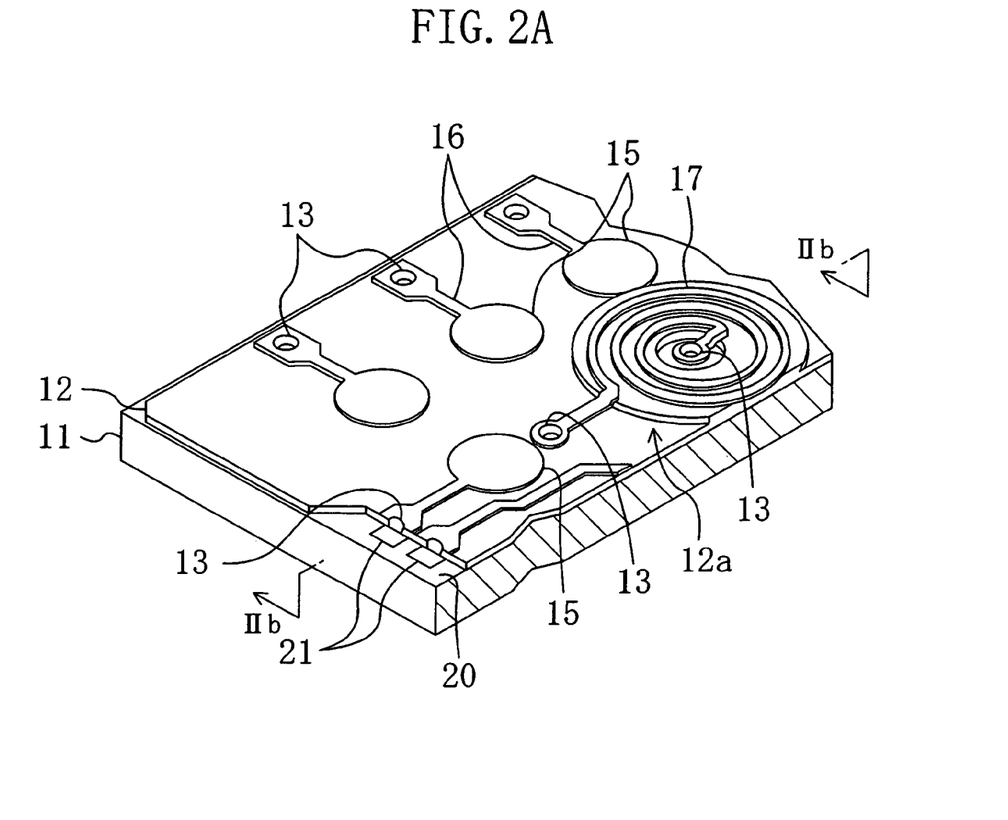
FIG. 2A is an enlarged perspective sectional view of part of FIG. 1.
Figure 2B:
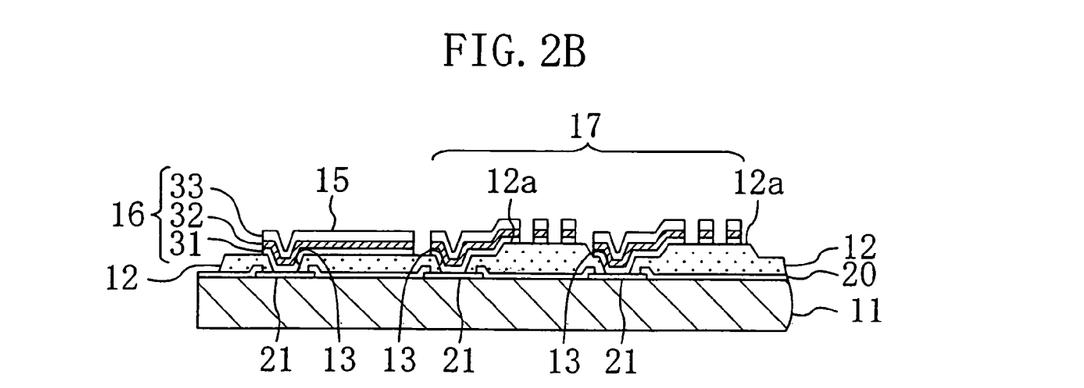
FIG. 2B is a sectional view showing the structure of the same part taken on the line IIb-IIb of FIG. 2A.

FIG. 2A is an enlarged perspective view of a left corner portion of the semiconductor device shown in FIG. 1, partly including its cross section. FIG. 2B shows the sectional structure of the same portion taken on the line IIb-IIb of FIG. 2A.

As shown in FIGS. 1, 2A and 2B, a first insulating resin film 12 having a thickness of about 4 μm to 6 μm is formed through a passivation film 20 on the main surface of a semiconductor chip 11 with an integrated circuit (not shown) formed on the main surface. In the first insulating resin film 12, a plurality of contact holes 13 are formed to expose pad electrodes (electrodes of semiconductor elements) 21 of the integrated circuit.

A plurality of lands 15 of substantially flat-circular shape are formed on the first insulating resin film 12. The upper surfaces of the lands 15 are each provided with a ball bump (protruding electrode) 14 as an external terminal. The lands 15 are connected to the contact holes 13 through interconnects 16, respectively. Regions of the first insulating resin film 12 provided with the lands 15 relatively sparsely are formed with an inductor formation region 12a having a greater thickness than its surrounding region. On the inductor formation region 12a, an inductor 17 is formed of which both terminals are connected to the pad electrodes 21 through the contact holes 13, respectively.

As shown in FIG. 1, a second insulating resin film 18 is formed on the first insulating resin film 12. The second insulating resin film 18 covers the interconnects 16 and the inductors 17 and serves as an outer insulating film having a plurality of openings 18a for placing therein the ball bumps 14 electrically connected to the respective lands 15.

As shown in FIG. 2B, the land 15, interconnect 16 and inductor 17 are each composed of a barrier layer 31, a plating seed layer 32 and a body layer 33, which are formed from the pad electrodes 21 side in this order. The barrier layer 31 is made of a tungsten alloy containing about 10% of titanium (TiW), for example. The plating seed layer 32 is made of copper (Cu), for example. The body layer 33 is made of copper.

Thus, the semiconductor device according to this embodiment makes the inductor formation region 12a of the first insulating resin film 12 thicker than the surrounding region, that is, the regions of the first insulating resin film 12 where the contact holes 13, lands 15 and interconnects 16 are formed. This prevents leakage of high-frequency signals from the inductor 17 into the semiconductor chip 11 through the first insulating resin film 12. Therefore, an energy loss caused by signal leakage in the inductor 17 can be reduced.

Figure 3:
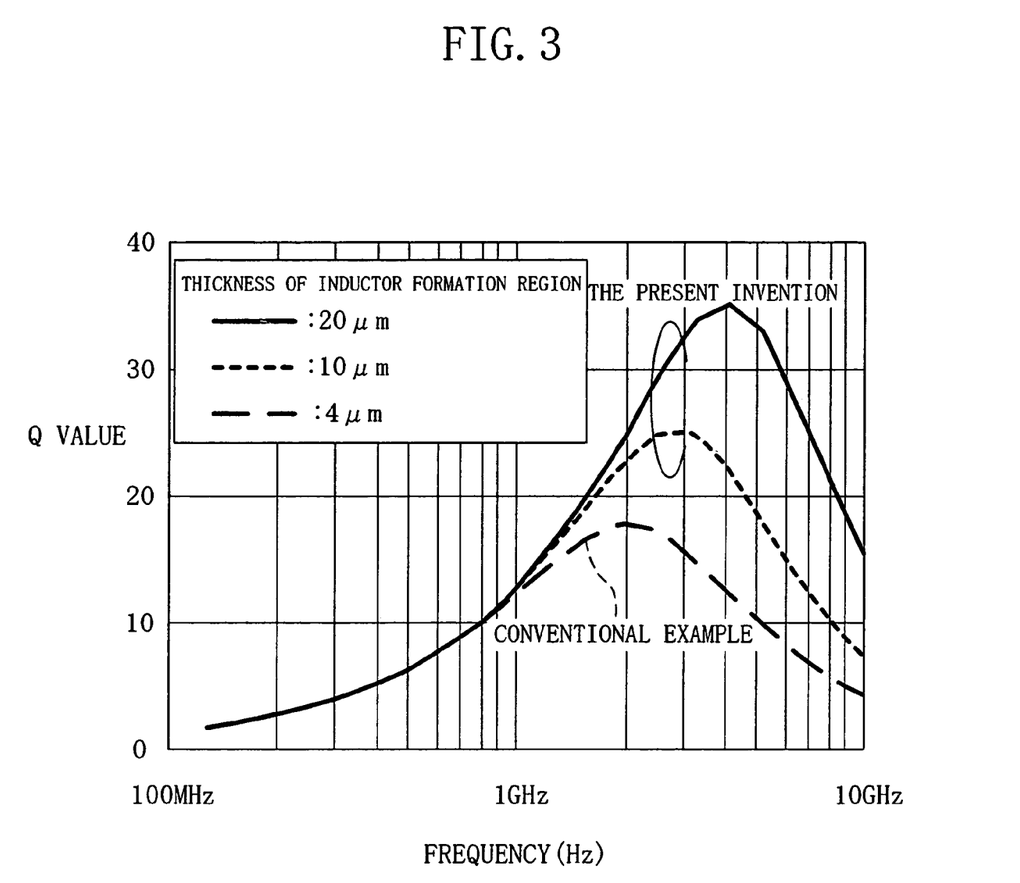
FIG. 3 is a graph showing the frequency dependence of the Q value of an inductor in the semiconductor device according to the embodiment of the present invention in comparison with that of the conventional example, in which the thickness of an inductor formation region is used as a parameter.

FIG. 3 shows the frequency dependence of the Q value of the inductor 17 according to this embodiment in comparison with that of the conventional example, in which the thickness of the inductor formation region 12a is used as a parameter. As shown in FIG. 3, particularly in the frequency band of several gigahertzes (GHz) or more, it is clear that the thicker the inductor formation region 12a is, the higher the Q value is.

Hereinafter, a method for fabricating the semiconductor device thus constructed will be described with reference to the drawings.

FIGS. 4A through 6D are sectional views showing process steps of fabricating a semiconductor device according to the embodiment of the present invention step by step.

Figure 4A:
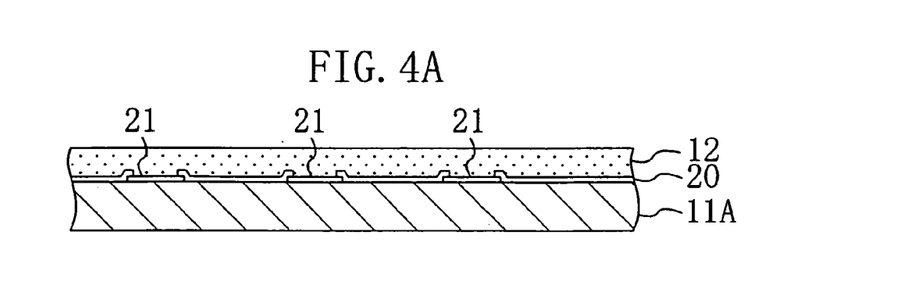
FIGS. 4A through 4D are sectional views showing process steps of a fabricating method of a semiconductor device according to the embodiment of the present invention step by step.

First as shown in FIG. 4A, a semiconductor wafer 11A is prepared which is formed, on the main surface thereof, with an integrated circuit (not shown), a plurality of pad electrodes 21 for the input and output to and from the integrated circuit, and a passivation film 20 of silicon nitride ($Si_3N_4$) deposited on the entire main surface other than the surfaces of the pad electrodes 21. In this embodiment, the pad electrodes 21 are each made of an alloy of aluminum (Al) and silicon (Si) (Al—Si alloy), an alloy of aluminum (Al), silicon (Si) and copper (Cu) (Al—Si—Cu alloy), or the like. Subsequently, a first insulating resin film 12 made of; for example, a polybenzoxazole (PBO) resin material serving as a positive photosensitive resin is applied over the entire surface of the semiconductor wafer 11A including the surfaces of the passivation film 20 and the pad electrodes 21.

Figure 4B:
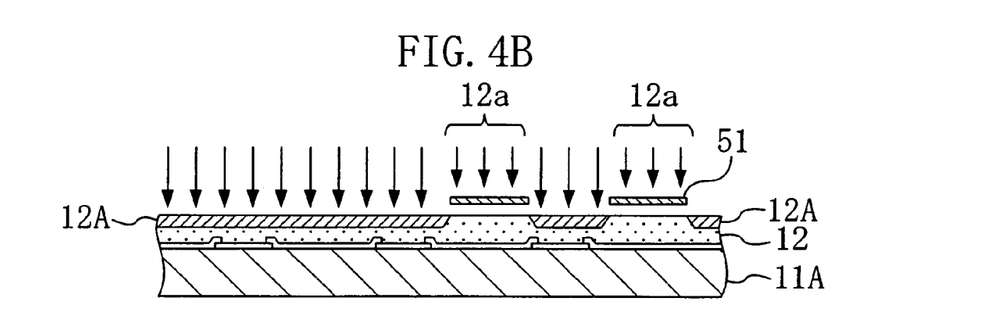

As shown in FIG. 4B, using a first mask 51 having a mask pattern covering the inductor formation region 12a, a first light exposure is performed on the first insulating film 12 with ultraviolet radiation. A first light-exposed portion 12A is thus formed in the first insulating resin film 12.

Figure 4C:
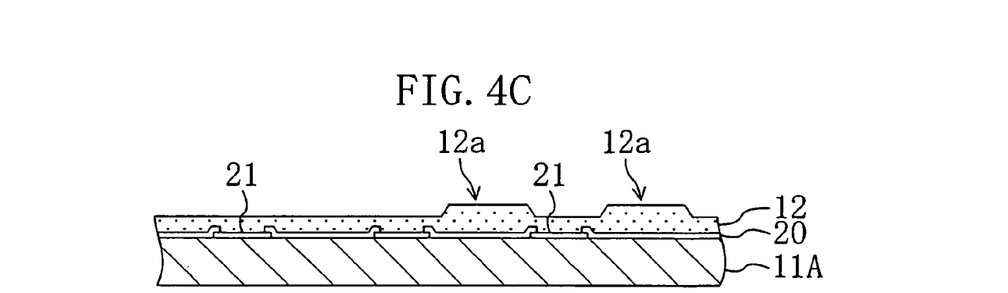

Subsequently, as shown in FIG. 4C, the first light-exposed portion 12A is removed by a first development, thereby forming the inductor formation region 12a in the first insulating resin film 12.

Figure 4D:
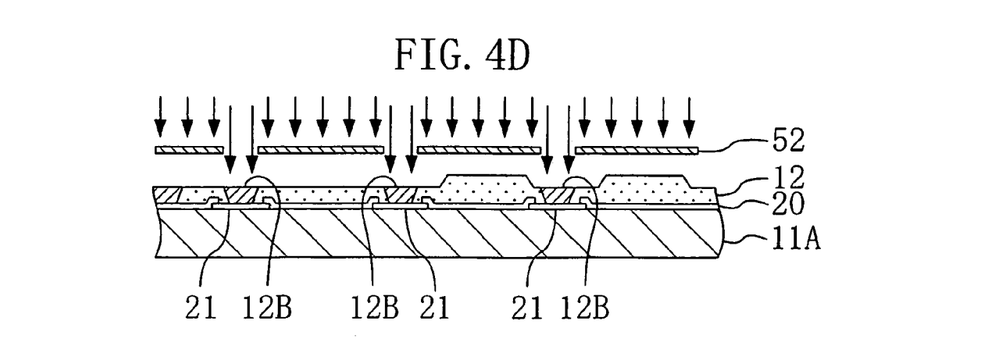

Next, as shown in FIG. 4D, using a second mask 52 with an opening pattern for contact holes located at respective opposed positions to the pad electrodes 21, a second light exposure by ultraviolet radiation is performed on the portions of the first insulating resin film 12 whose upper portions have been removed by the first development. Thus, second light-exposed portions 12B are each formed in the contact-hole formation region of the first insulating resin film 12.

Figure 5A:
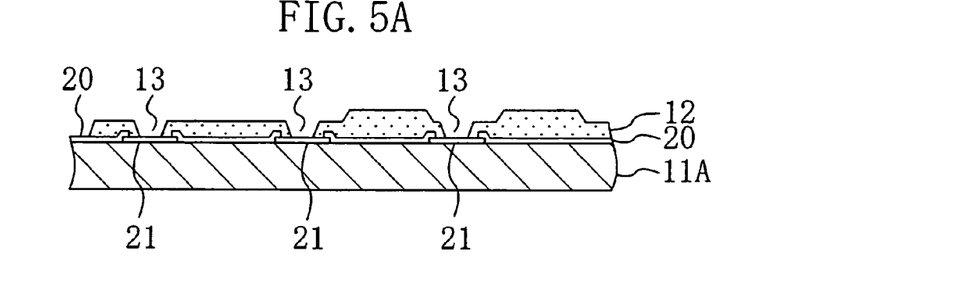
FIGS. 5A through 5D are sectional views showing process steps of the fabricating method of a semiconductor device according to the embodiment of the present invention step by step.

As shown in FIG. 5A, the second light-exposed portions 12B are removed by a second development, thereby forming, in the first insulating resin film 12, contact holes 13 exposing the corresponding pad electrodes 21. Consequently, these two-time light exposure and development steps make the inductor formation region 12a of the first insulating resin film 12 thickened to such a thickness that a leakage loss in the inductor can be prevented, and make the contact-hole formation portion of the first insulating resin film 12 thinned to such a thickness that the contact hole 13 can be surely formed at a desired resolution.

In the first light exposure step shown in FIG. 4B, exposure light is focused onto the position in the vicinity of the surface of the first insulating resin film 12. On the other hand, in the second light exposure step shown in FIG. 4D, exposure light is focused onto the position in the vicinity of the surface portion of the first insulating resin film 12 whose upper portion has been selectively removed.

The lower limit of thickness of the contact-hole 13 formation portion of the first insulating resin film 12 is determined according to the insulation performance of the film 12, whereas the upper limit of thickness of the inductor formation region 12a is determined according to whether or not light exposure and development for forming the contact hole 13 are surely performed. In this embodiment, the lower limit of thickness of the first insulating resin film 12 is set preferably at about 4 μm to 6 μm, more preferably at 5 μm. In addition, although the Q value increases as the inductor formation region 12a becomes thicker as shown in FIG. 3, the thickness of the first insulating resin film 12 is set preferably at about 5 μm to 50 μm, more preferably at about 10 μm, in order to ensure that the film 12 is applied uniformly and subjected to appropriate light exposure and development. It is to be noted that when the thickness of the inductor formation region 12a is set at 5 μm, the thickness of the contact-hole 13 formation region is naturally set at a value smaller than 5 μm. Herein, the thickness of the first insulating resin film 12 in this embodiment is that of the film 12 obtained after the film 12 is heat cured, that is, after a post cure (post-bake).

As a developing solution for the first insulating resin film 12, use is made of a weak alkaline or an organic developing solution in which the pad electrode 21 is undissolvable during development.

Figure 5B:
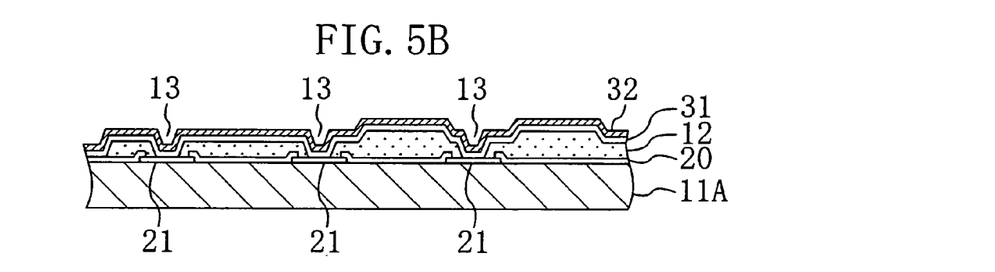

As shown in FIG. 5B, the first insulating resin film 12 is subjected to a predetermined post cure, after which a barrier layer 31 of tungsten titanium and a plating seed layer 32 of copper are deposited by sputtering or otherwise over the entire surface of the semiconductor wafer 11A including the surfaces of the first insulating resin film 12, the passivation film 20 and the pad electrodes 21 exposed at the bottom of the contact holes 13.

In this process step, prior to the deposition of the barrier layer 31 and the plating seed layer 32, plasma treatment is performed on the surface of the first insulating resin film 12 to change the surface thereof into a microscopically roughened state. This enhances the adhesion strength of the first insulating resin film 12 to the barrier layer 31. Also in this step, the residue of the first insulating resin film 12 left on the pad electrode 21 after the development and a surface oxide film existing on the pad electrode 21 are removed. This reduces the contact resistance between the pad electrode 21 and the barrier layer 31. It is to be noted that the plasma treatment needs only to selectively control the amount of etching on the first insulating resin film 12 relative to the etching amounts of the pad electrode 21 and the passivation film 20. For example, reactive ion etching (RIE) using an oxygen ($O_2$) gas, a mixed gas of oxygen and carbon tetrafluoride ($CF_4$), or a mixed gas of oxygen and argon (Ar) is recommendable for the plasma treatment.

The barrier layer 31 is preferably made of a metal having high adhesion properties to the first insulating resin film 12, the passivation film 20 and the pad electrode 21 and having resistance to an etching solution with which the plating seed layer 32 is etched. In this embodiment, a tungsten titanium alloy (10% Ti-90% W) is used for the barrier layer 31. Considering the resistance of the plating seed layer 32 to the etching solution, the barrier layer 31 preferably has a thickness of about 0.2 μm to 0.5 μm.

The plating seed layer 32 serves as a seed layer in forming a body layer 33 of interconnects 16 and an inductor 17 by electrolytic plating. To ensure appropriate functioning of the seed layer, it is preferably made of a metal having low resistivity. In this embodiment, copper is used for the seed layer. Considering the electric resistance and deposition stress of the plating seed layer 32 and ease of etching on the deposited layer 32, it preferably has a thickness of about 0.3 μm to 0.5 μm.

Figure 5C:
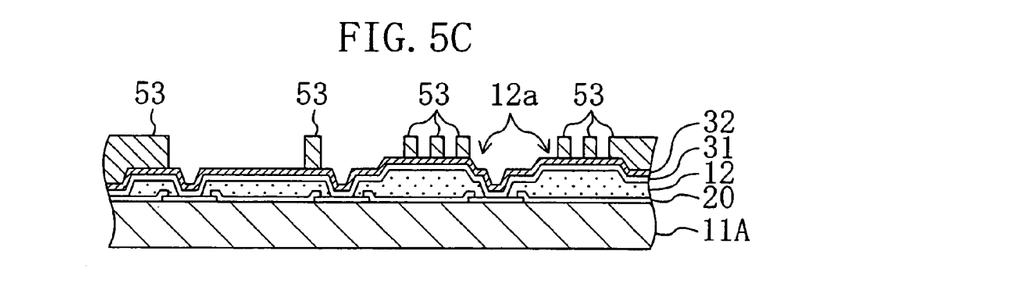

Then, as shown in FIG. 5C, a resist pattern 53 having a design pattern for interconnects 16 and an inductor 17 is formed on the plating seed layer 32 by photolithography. In this step, the resist pattern 53 is formed so that the portion thereof on the upper surface of the inductor formation region 12a of the first insulating resin film 12 has a thickness of about 8 μm to 10 μm. Subsequently, plasma treatment using an oxygen gas is performed to remove residues of the resist pattern generated by the development.

Figure 5D:
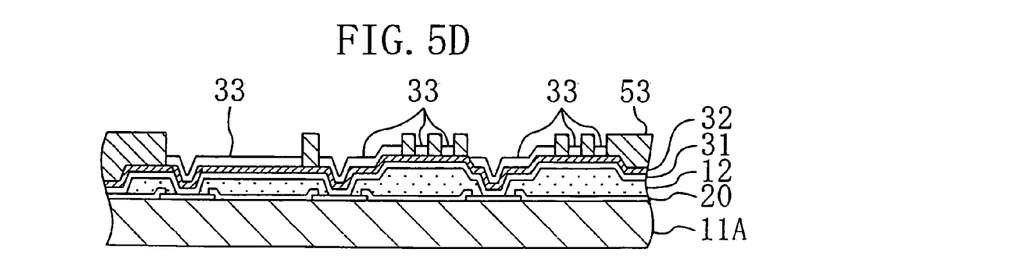

Next, as shown in FIG. 5D, using the resist pattern 53 as a mask, a body layer 33 of copper constituting the interconnects or the like is formed on the plating seed layer 32 by electrolytic plating. Considering the electric resistance and mechanical strength of the body layer 33, it preferably has a thickness of about 10 μm to 14 μm.

Figure 6A:
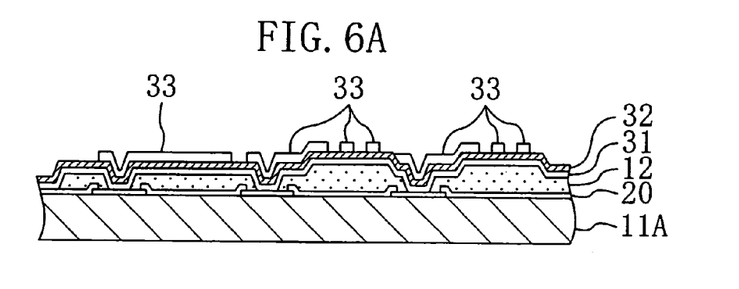
FIGS. 6A through 6D are sectional views showing process steps of the fabricating method of a semiconductor device -according to the embodiment of the present invention step by step.

As shown in FIG. 6A, the resist pattern 53 is removed, after which plasma treatment using an oxygen gas is performed to remove residues of the resist pattern 53.

Figure 6B:
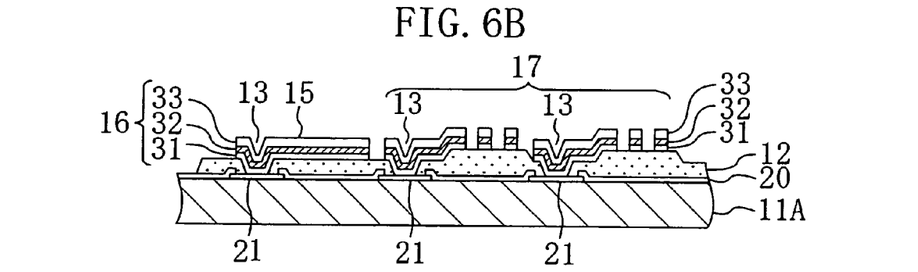

Subsequently, as shown in FIG. 6B, the body layer 33 and the plating seed layer 32 each made of copper are etched with an etching solution having a high selectivity with respect to the barrier layer 31, such as a sodium persulfate ($Na_2S_2O_8$) solution. In this etching step, the plating seed layer 32 is thinner than the body layer 33, so that the portion of the plating seed layer 32 with the body layer 33 absent thereon is removed off first. As a result, the barrier layer 31 is exposed at that portion. Next, using the body layer 33 as a mask, etching with a hydrogen peroxide solution ($H_2O_2$) is performed to remove the barrier layer 31, thereby forming, on the inductor formation region 12a of the first insulating resin film 12, an inductor 17 of a desired design pattern of which both terminals are connected to the pad electrodes 21 through the contact holes 13, respectively. Simultaneously, a land 15 and an interconnect 16 of which one end is connected to the land 15 and of which the other end is connected to the pad electrode 21 through the contact hole 13 are formed on the portion of the first insulating resin film 12 other than the inductor formation region 12a. The land 15, interconnect 16 and inductor 17 are each composed of the barrier layer 31, the plating seed layer 32 and the body layer 33, which are deposited in bottom-to-top order.

Figure 6C:
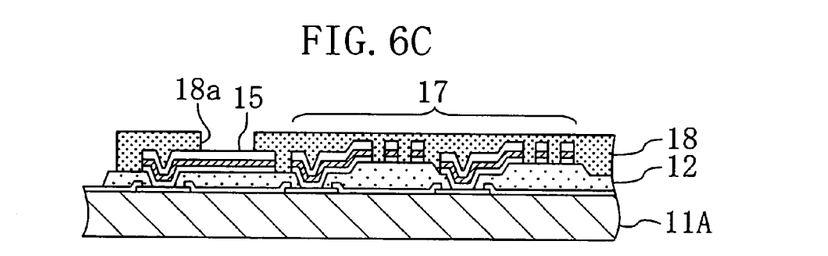

Next, as shown in FIG. 6C, a second insulating resin film 18 made of a photosensitive resin material is applied over the entire surface of the first insulating resin film 12 including the surfaces of the inductor 17, land 15 and the like, and then an opening 18a exposing the land 15 at the bottom thereof is formed by photolithography in the applied second insulating resin film 18. The second insulating resin film 18 preferably has a thickness of about 5 μm to 10 μm to ensure the flatness thereof in its application and appropriate light exposure and development.

Figure 6D:
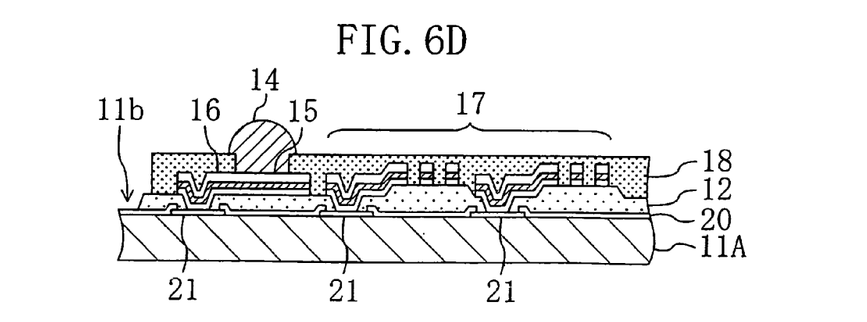

As shown in FIG. 6D, on the land 15 exposed in the second insulating resin film 18, a soldering paste material is attached by printing, for example. The attached material is heat fused to make the top thereof hemispherical, thereby forming a ball bump 14 as an external terminal of the semiconductor device. It is to be noted that the forming method of the ball bump 14 is not limited to printing (fusion printing). Alternatively, a solder ball material may be placed in the opening 18a and the material may be heat fused to form the ball bump 14. After the ball-bump formation, the semiconductor wafer 11A is cut with a dicing saw along predetermined scribe lines 11b thereon, thereby dividing the wafer 11A into multiple semiconductor chips 11.

As described above, according to a fabrication method of a semiconductor device of the present invention, an inductor 17 is formed on a first insulating resin film 12 covering an integrated circuit on a semiconductor wafer 11A, before which an inductor formation region 12a of the first insulating resin film 12 is made thicker than a portion of the film 12 in which a contact hole 13 is to be formed. To attain this structure, a positive photosensitive resin is used for the first insulating resin film 12. Of the film 12, the inductor formation region 12a is patterned in the first light exposure and development steps and the contact hole 13 exposing the pad electrode 21 is patterned in the second light exposure and development steps. Thereafter, the whole first insulating resin film 12 is heat cured (post-cured) at a time. This simplifies the fabrication process of the semiconductor device, thereby providing a lower-cost semiconductor device.

Moreover, in the first light exposure, exposure light is focused onto the position in the vicinity of the surface of the first insulating resin film 12, and in the second light exposure, exposure light is focused onto the position in the vicinity of the surface portion of the first insulating resin film 12 whose upper portion has been selectively removed by patterning the inductor formation region 12a. This enables a fine patterning for both the inductor formation region 12a and the contact hole 13. As a result, formation of the contact hole 13 in the light exposure and development steps is not restricted by the thickness of the first insulating resin film 12 after the formation. In addition, the inductor formation region 12a of the first insulating resin film 12 can be thickened to such a thickness that a leakage loss in the inductor 17 is prevented sufficiently.

In this embodiment, the inductor formation region 12a is integrally formed with the first insulating resin film 12. However, such integration is not necessarily required. As an alternative example, an inductor formation region of an first insulating resin film having a uniform thickness may be provided with another insulating film, whereby the inductor formation region is made thicker than its surrounding region.

In this embodiment, the land 15, interconnect 16 and inductor 17 are formed by electrolytic plating. The forming method thereof is not limited to this, and sputtering may be employed instead.

What is claimed is:

1. A method for fabricating a semiconductor device, comprising:
   a first step of forming a first insulating film, having a plurality of regions, over the entire main surface of a semiconductor wafer including the surfaces of a plurality of pad electrodes, the semiconductor wafer having a plurality of integrated circuits formed on the main surface of the chip and the plurality of pad electrodes formed on the main surface of the chip and electrically connected to the corresponding integrated circuits;
   a second step of masking only an inductor formation region of the first insulating film while leaving the other regions of the first insulating film unmasked, and removing upper portions of the first insulating film so that a thickness of the inductor formation region is greater than a thickness of a land formation region;
   a third step of forming a plurality of contact holes exposing therein the respective pad electrodes in portions of the first insulating film whose upper portions have been selectively removed and which are located on the respective pad electrodes; and
   a fourth step of forming, on the inductor formation region of the first insulating film, an inductor of which both terminals are connected to the pad electrodes through the contact holes, respectively, and forming a land on the land formation region on the first insulating film.

2. The method of claim 1, wherein the first insulating film is made of a positive photosensitive resin material.

3. The method of claim 2,
   wherein the second step comprises the sub-step of exposing the photosensitive resin material to light with the inductor formation region of the photosensitive resin material masked, and then removing the light-exposed portions of the photosensitive resin material by development, and
   the third step comprises the sub-step of selectively exposing to light portions of the photosensitive resin material whose upper portions have been selectively removed by the development and which are located on the respective pad electrodes, and then removing the light-exposed portions by development.

4. The method of claim 3, wherein the thicknesses of the portions of the photosensitive resin material to be exposed to light in the second step are set to such an extent that the remaining portions of the photosensitive resin material located under the portions thereof to be exposed to light and on the pad electrodes can obtain a desired resolution.

5. The method of claim 2,
wherein the second step further comprises the sub-step of focusing exposure light onto the position in the vicinity of the surface of the photosensitive resin material, and
the third step further comprises the sub-step of focusing exposure light onto the position in the vicinity of the surface of each portion of the photosensitive resin material whose upper portion has been selectively removed.

6. The method of claim 2, wherein the photosensitive resin material is cured after the third step.

7. The method of claim 1, wherein the fourth step comprises the sub-steps of:
forming a plating seed layer over the entire surface of the first insulating film including the surfaces of the contact holes;
forming a resist pattern including a pattern for an inductor and a pattern for a land and an interconnect, the pattern for an inductor being located on the inductor formation region of the plating seed layer, the pattern for a land and an interconnect being located on a region of the plating seed layer other than the inductor formation region;
forming a metal film on the plating seed layer by plating using the resist pattern as a mask; and
removing the resist pattern and then removing the plating seed layer by etching using the metal film as a mask, thereby forming an inductor, a land and an interconnect from the metal film.

8. The method of claim 7, further comprising, after the fourth step, the steps of:
forming a second insulating film over the entire surface of the first insulating film including the surfaces of the inductor, land and interconnect; and
forming an opening in a portion of the second insulating film on the land and then forming a protruding electrode in the opening so that it is connected to the land and the top thereof protrudes from the second insulating film.

9. The method of claim 1,
wherein the semiconductor wafer is provided with scribe lines with which the plurality of integrated circuits are defined to each other; and
the method comprises the step of dividing the semiconductor wafer along the scribe lines to form a plurality of semiconductor chips after the fourth step.

10. A method for fabricating a semiconductor device, comprising:
a first step of forming a first insulating film, having a plurality of regions, over the entire main surface of a semiconductor wafer including the surfaces of a plurality of pad electrodes, the semiconductor wafer having a plurality of integrated circuits formed on the main surface of the chip and the plurality of pad electrodes formed on the main surface of the chip and electrically connected to the corresponding integrated circuits;
a second step of masking only an inductor formation region of the first insulating film while leaving the other regions of the first insulating film unmasked, and removing upper portions of the first insulating film so that a thickness of the inductor formation region is greater than a thickness of an interconnect formation region;
a third step of forming a plurality of contact holes exposing therein the respective pad electrodes in portions of the first insulating film whose upper portions have been selectively removed and which are located on the respective pad electrodes; and
a fourth step of forming, on the inductor formation region of the first insulating film, an inductor of which both terminals are connected to the pad electrodes through the contact holes, respectively, and forming an interconnect on the interconnect formation region on the first insulating film.

11. The method of claim 10, wherein the first insulating film is made of a positive photosensitive resin material.

12. The method of claim 11,
wherein the second step comprises the sub-step of exposing the photosensitive resin material to light with the inductor formation region of the photosensitive resin material masked, and then removing the light-exposed portions of the photosensitive resin material by development, and
the third step comprises the sub-step of selectively exposing to light portions of the photosensitive resin material whose upper portions have been selectively removed by the development and which are located on the respective pad electrodes, and then removing the light-exposed portions by development.

13. The method of claim 12, wherein the thicknesses of the portions of the photosensitive resin material to be exposed to light in the second step are set to such an extent that the remaining portions of the photosensitive resin material located under the portions thereof to be exposed to light and on the pad electrodes can obtain a desired resolution.

14. The method of claim 11,
wherein the second step further comprises the sub-step of focusing exposure light onto the position in the vicinity of the surface of the photosensitive resin material, and
the third step further comprises the sub-step of focusing exposure light onto the position in the vicinity of the surface of each portion of the photosensitive resin material whose upper portion has been selectively removed.

15. The method of claim 11, wherein the photosensitive resin material is cured after the third step.

16. The method of claim 10, wherein the fourth step comprises the sub-steps of:
forming a plating seed layer over the entire surface of the first insulating film including the surfaces of the contact holes;
forming a resist pattern including a pattern for an inductor and a pattern for a land and an interconnect, the pattern for an inductor being located on the inductor formation region of the plating seed layer, the pattern for a land and an interconnect being located on a region of the plating seed layer other than the inductor formation region;
forming a metal film on the plating seed layer by plating using the resist pattern as a mask; and
removing the resist pattern and then removing the plating seed layer by etching using the metal film as a mask, thereby forming an inductor, a land and an interconnect from the metal film.

17. The method of claim 16, further comprising, after the fourth step, the steps of:
  forming a second insulating film over the entire surface of the first insulating film including the surfaces of the inductor, land and interconnect; and
  forming an opening in a portion of the second insulating film on the land and then forming a protruding electrode in the opening so that it is connected to the land and the top thereof protrudes from the second insulating film.

18. The method of claim 10,
  wherein the semiconductor wafer is provided with scribe lines with which the plurality of integrated circuits are defined to each other; and
  the method comprises the step of dividing the semiconductor wafer along the scribe lines to form a plurality of semiconductor chips after the fourth step.

* * * * *